United States Patent [19]
Yamamoto

[11] Patent Number: 5,361,395
[45] Date of Patent: Nov. 1, 1994

[54] GAIN CONTROL CIRCUIT

[75] Inventor: Toshihisa Yamamoto, Kokubunji, Japan

[73] Assignee: Kabushiki Kaisha Toshiba, Kawasaki, Japan

[21] Appl. No.: 842,495

[22] Filed: Feb. 27, 1992

[30] Foreign Application Priority Data

Feb. 28, 1991 [JP] Japan .................. 3-010029[U]

[51] Int. Cl.⁵ .................. H04Q 7/02; H04B 7/00; H04B 1/06
[52] U.S. Cl. .................. 455/33.2; 455/54.1; 455/234.1; 455/242.1; 379/59; 370/95.3; 375/98
[58] Field of Search ............ 455/54.1, 33.2, 126, 455/89, 127, 232.1, 234.1, 234.2, 239.1, 240.1, 241.1, 242.1, 243.1, 244.1, 245.1, 249.1, 237.1, 236.1, 235.1; 375/98; 379/95.3, 58, 59, 63; 330/254, 129, 278, 280, 281, 282; 370/95.3

[56] References Cited

U.S. PATENT DOCUMENTS

| | | | |
|---|---|---|---|
| 4,030,055 | 6/1977 | Ienaka et al. | 455/237.1 |
| 4,606,075 | 8/1986 | Eastmond | 455/234.2 |
| 4,757,502 | 7/1988 | Meuriche et al. | 375/98 |
| 4,910,467 | 3/1990 | Leitch | 375/98 |
| 4,955,077 | 8/1990 | Sugayama | 455/236.1 |
| 5,001,776 | 3/1991 | Clark | 455/236.1 |
| 5,050,192 | 9/1991 | Nawata | 455/245.1 |
| 5,119,508 | 6/1992 | Shamasundara | 455/234.1 |
| 5,128,629 | 7/1992 | Trinh | 375/98 |
| 5,142,695 | 8/1992 | Roberts et al. | 455/234.1 |
| 5,175,883 | 12/1992 | Ueno | 455/242.2 |
| 5,203,019 | 4/1993 | Rinderle | 455/241.1 |
| 5,204,977 | 4/1993 | Feldt | 455/241.1 |

FOREIGN PATENT DOCUMENTS 60-248028 12/1985 Japan .................. 455/235.1

Primary Examiner—Edward F. Urban
Assistant Examiner—Lisa Charouel
Attorney, Agent, or Firm—Finnegan, Henderson, Farabow, Garrett & Dunner

[57] ABSTRACT

A gain control circuit in which a switch is provided in series with a capacitor in a time constant circuit so that, under control of a controller, the switch is closed in its own signal reception and opened in an idle time other than the signal reception to perform gain control, whereby the capacitor can independently hold a signal reception level at the time of its own previous signal reception regardless of monitoring signal reception during the idle time.

17 Claims, 11 Drawing Sheets

GAIN CONTROL CIRCUIT

BACKGROUND OF THE INVENTION

1. Field of the Invention

The present invention relates to an automatic gain control (AGC) circuit for use in a high frequency circuit of a receiver or the like.

2. Description of the Related Art

In recent years, digitalized mobile telephone systems have been developed because of the realization of their ability for accurate communication. The mobile telephone system is based on a multi-channel access (MCA) system in which one of the communication channels corresponding to a suitable frequency is selected according to several conditions.

In a conventional analog mobile telephone system, a channel change-over during a call inevitably involves the instantaneous break of the voice signal. However, when the quality of the speech becomes degraded, an operator often switches the current channel to another suitable communication channel to avoid this degradation. With a digitalized mobile telephone system, since an effect of an instantaneous break is remarkably reduced, the channel change-over can be conducted rather successfully for the purpose of enhancing frequency utilization efficiency. The channel change-over during the call is carried out both in the case where communication channel change-over is desired in an identical area and in the case where change-over to a base station called "hand-off" is desired.

In more detail, when a mobile station terminal moves during a call, the communication of the terminal with an initially connected base station becomes difficult. The operation to search for a new base station closest thereto and the switching connection thereto is termed "hand-off". There has recently been proposed a hand-off system of a mobile-station-initiative type in which, during a call, a mobile station measures the level of a signal received from a nearby base station and reports the measured level to the base station, while the base station determines a base station to be switched on the basis of the received report. In the hand-off system, a mobile station can switch to a different carrier frequency during an idle time other than the communication time, monitor the level of electromagnetic waves received from another base station, and select an optimum one of the base stations during the channel change-over. This feature one of the major advantages of a mobile telephone system of a time division multiple access (TDMA) type. This hand-off system is highly effective in realizing efficient and reliable control for small sized zones.

FIG. 9 is a diagram for explaining the hand-off operation of the mobile telephone system of the TDMA communication type from a base station A to a base station B. In the drawing, a control station 91 is connected to the base stations A and B which can be connected to a mobile station 90. The mobile station 90 measures the electric field strength of a received signal strength indicator (RSSI) or a bit error rate (BER) of a signal received on another communication channel from another base station during the idle communication time, and reports the measured result to the base station A being initially connected to the mobile station. When the RSSI is larger than the level of the signal received on its own communication channel or when the bit error rate is small, the base station A transmits a hand-off signal to the mobile station 90. The mobile station 90, when receiving the hand-off signal, switches the current channel to the communication channel of the base station B to maintain subsequent good communications.

For the purpose of keeping constant the level of the received signal, the mobile station contains an automatic gain control (AGC) circuit provided in a high frequency circuit or the like of the receiver side. The AGC circuit functions to keep a constant gain by feeding the output of the high frequency amplification circuit back thereto.

Referring to FIG. 10, there is shown a block diagram of an arrangement of a prior art AGC circuit, in which an intermediate frequency received from an input terminal amplified at an intermediate frequency amplifier 106, subjected at a band pass filter 107 to a removal of signal components in a predetermined frequency band, and then output from an output terminal 108. In order to keep constant the output of the filter 107, the intermediate frequency output of the band pass filter 107 is applied to an AGC circuit 100 which in turn controls the gain of the intermediate frequency amplifier 106.

More specifically, in the AGC circuit 100, the intermediate frequency signal received from the band pass filter 107 is detected at a level detector 101 and then supplied to an error amplifier 104 through a time constant circuit 102 which provides a level signal of the smoothed intermediate frequency signal after a predetermined time lag determined by the time constant circuit 102. The error amplifier 104 finds a difference between the received level signal of the input intermediate frequency signal, i.e., a signal having a voltage based on electric charges accumulated in a capacitor 102-3 and a reference voltage level supplied from a reference voltage source 103 and sends a signal corresponding to the difference to the intermediate frequency amplifier 106 to control the gain of the intermediate frequency amplifier 106. As a result, the gain of the intermediate frequency signal can be controlled to be constant.

Meanwhile, the mobile station is monitoring for the aforementioned hand-off operation, that is, receiving a signal from another base station not communication-connected with the mobile station during the idle time for switching to the communication channel of the other base station. During this monitoring operation, the mobile station measures the RSSI or BER of a signal received from another base station during the idle time other than its substantial communication time.

After monitoring in the idle mode, when it is desired for the mobile station to switch to a receive-signal carrier frequency to be returned to its own communication operation, since the AGC circuit is set in such a monitor mode that the RSSI is measured in the idle condition, the mobile station cannot be returned immediately to its previous communication state. In other words, the output of the AGC circuit transient.

Therefore, the prior art AGC circuit has had such a problem that, even after the mobile station switches own communication channel, it cannot be put immediately in its previous stationary communication state but it requires a certain time to return to the stationary communication state.

SUMMARY OF THE INVENTION

It is an object of the present invention to provide an automatic gain control (AGC) circuit for use in a mobile station of a mobile telephone system as mentioned above, which can eliminate the problem in the prior art that, after the monitoring operation during idle or non-communication time, the AGC circuit cannot be returned immediately to its stationary state but is returned after a predetermined time, which prevents the AGC circuit from maintaining a constant gain and thus has an adverse effect on continuous communication; in other words, to provide an AGC that can immediately operate without any time lag.

In accordance with an aspect of the present invention, there is provided an AGC circuit in which previous data on the level of an output signal of an amplifier is held and after passage of a predetermined time, a control signal to he sent to the amplifier is generated on the basis of the held data, so that the gain of the amplifier is controlled for the amplifier to produce a constant output signal, whereby the output signal of the amplifier can be quickly returned to its previous level.

DESCRIPTION OF THE PREFERRED EMBODIMENTS

An embodiment of the present invention will be explained in detail with reference to the attached drawings.

Figure 1:
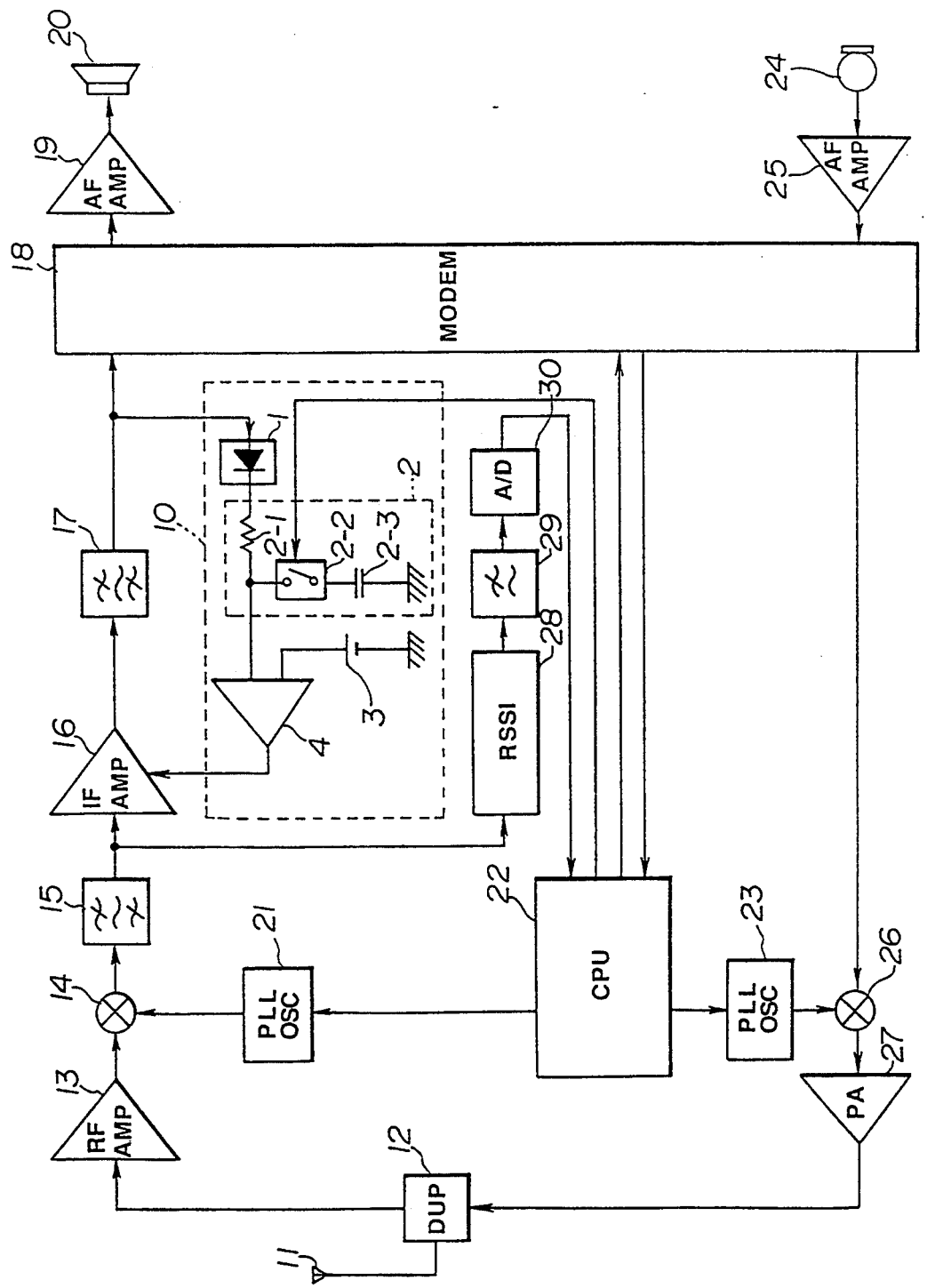
FIG. 1 is a block diagram of an arrangement of a mobile station used in a mobile telephone system in accordance with an embodiment of the present invention.

Referring first to FIG. 1, there is shown a block diagram of an arrangement of a mobile station used in a mobile telephone system in accordance with an embodiment of the present invention. The present mobile telephone system is an MCA communication system of the TDMA type.

In FIG. 1, a radio frequency signal transmitted from a base station connected via a spatial link to the mobile station of FIG. 1 is received at an antenna 11 and then sent through a duplexer 12 to a high frequency amplifier 13 to be amplified therein. The amplified high frequency signal is further mixed at a reception mixer 14 with a reception local oscillation frequency signal received from a reception local oscillator 21 to generate an intermediate frequency signal. The intermediate frequency signal is subjected at a band pass filter 15 to a removal of its signal components having frequencies other than a predetermined frequency band and then amplified at an intermediate frequency amplifier 16 which constitutes level control means. The signal amplified at the intermediate frequency amplifier 16 is further subjected at a band pass filter 17 to a removal of its signal components having frequencies other than a predetermined frequency band. Thereafter, the filtered signal is modulated at a modem 18, amplified at a low frequency amplifier 19 and then output from a loudspeaker 20 in the form of voice.

Meanwhile, the intermediate frequency signal issued from the band pass filter 17 is also applied to an AGC circuit 10 to keep constant the level of the intermediate frequency signal through the gain control of the intermediate frequency amplifier 16 by the AGC circuit 10.

On the other hand, a voice emitted from a microphone 24 is amplified at audible frequency (AF) amplifier 25, modulated at the modem 18, and then applied to a transmission mixer 26 as a modulation signal. In the mixer 26, the modulation signal is mixed with a transmission oscillation frequency signal received from a transmission local oscillator 23 to generate a radio frequency signal, which in turn is then amplified at a transmission power amplifier 27 and then sent out from the antenna 11 through the duplexer 12.

In the AGC circuit 10, the received intermediate frequency signal is detected at a level detector 1 and applied as a smoothed intermediate frequency level signal to an error amplifier 4 which constitutes gain control means after a predetermined time lag determined by a time constant circuit 2. The error amplifier 4 finds a difference between the received intermediate frequency level signal, i.e., a signal having a voltage based on electric charges accumulated in a capacitor 2-3 and a reference voltage level received from a reference voltage source 3, and sends a signal indicative of the difference to the intermediate frequency amplifier 16 to control the gain of the amplifier 16, whereby the gain of the intermediate frequency signal is controlled to be constant.

Meanwhile, the received intermediate frequency signal passed through the band pass filter 15 is subjected at a received-electric-field intensity measuring unit 28 to a measurement of the electric field of the received intermediate frequency signal, subjected at a low pass filter 29 to a removal of signal components having predetermined high frequencies, subjected at an A/D converter 30 to a conversion into a digital signal, and then sent to a controller (CPU) 22 as data indicative of the intensity of electric field. The sent signal field intensity data is converted at the controller 22 into transmission data, modulated at the modem 18 and then transmitted to a base station. The base station, when receiving the signal electric field intensity data and determining a hand-off, transmits a hand-off signal to the mobile station. When the mobile station receives the hand-off signal in the same manner as voice data, the received hand-off signal is demodulated at the modem 18 and sent to the controller 22 so that the controller 22 controls the switching operation of the communication channel of the base station designated by the hand-off signal.

The controller 22 also performs its switching operation between the oscillation frequencies of the reception and transmission local oscillators 21 and 23 for transmission control. Further, the controller 22 controls a switch 2-2 to switch the current connection position of the capacitor 2-3 the other position in the AGC circuit 10.

Explanation will next be made as to the channel change-over operation of the mobile station based on the hand-off signal received from the base station.

Figure 2:
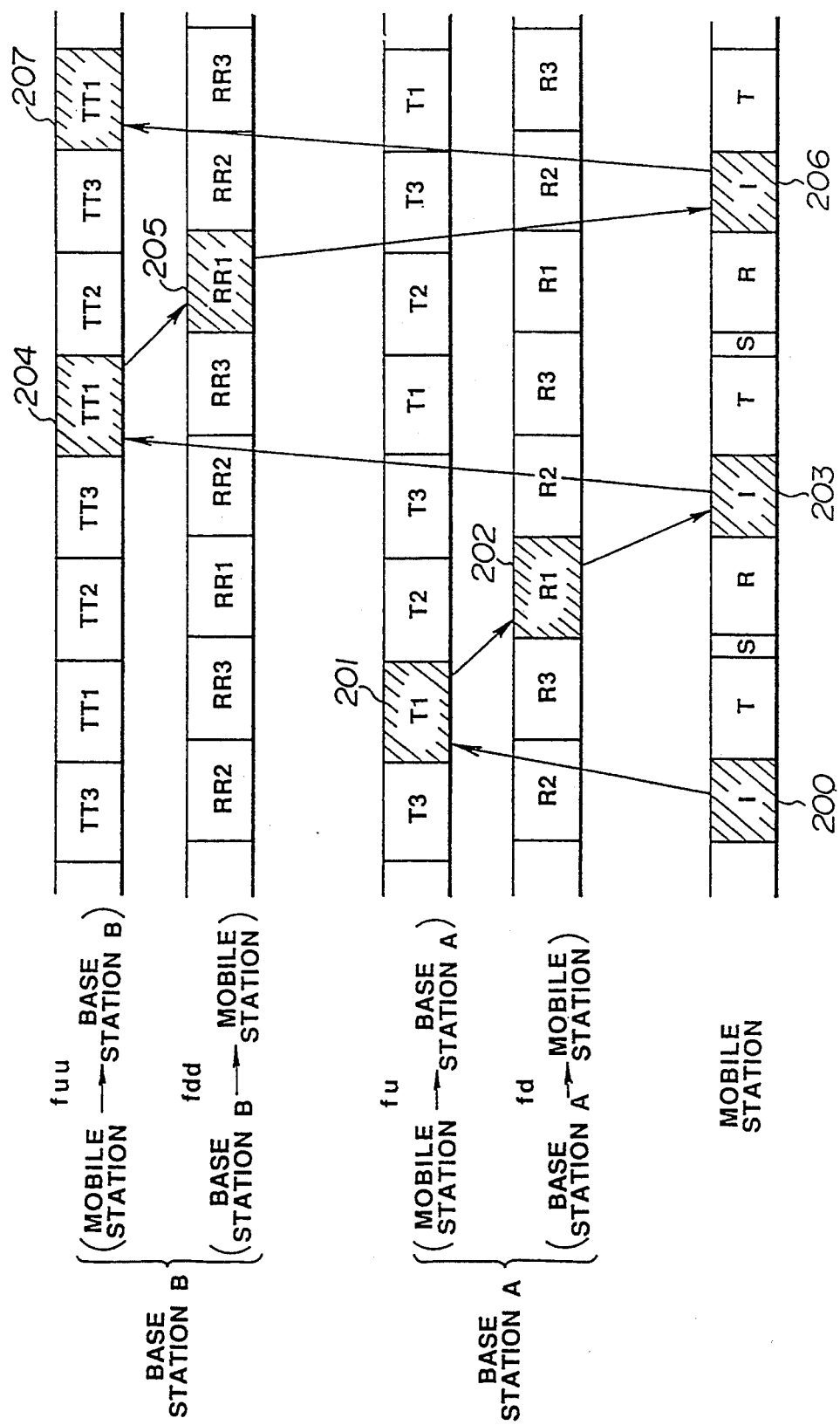
FIG. 2 is a diagram for explaining the channel change-over of the hand-off operation in a 3-channel multiplex TDMA communication system.

FIG. 2 is a diagram for explaining the channel change-over based on the hand-off signal when the mobile telephone system of FIG. 1 is of a 3-channel multiplex TDMA communication type. In FIG. 2, the mobile station is initially connected to a base station A so that a first transmission time slot T1 and a first reception time slot R1 of a base station A are used for a transmission time slot T and a reception time slot R of the mobile station. First, the mobile station communicating with the base station A, monitors another adjacent channel in its idle communication time, i.e., in an idle time slot 200, and transmits such a reception result as an RSSI to the base station A with use of a first transmission time slot 201. When a control station connected to the base station A determines that a hand-off should be carried out, the base station A transmits a hand-off signal to the mobile station. In other words, the mobile station receives the hand-off signal from the base station A with use of a first reception time slot 202. Thereafter, an idle time slot 203 of the mobile station, the mobile station further monitors another adjacent channel, switches a transmission frequency fu of the mobile station to a transmission frequency fuu to transmit with use of a transmission time slot 204 corresponding to the reception time slot of the base station B. Then the mobile station switches its reception frequency fd to a reception frequency fdd to receive with use of a reception time slot 205 corresponding to the transmission time slot of the base station B. In this way, even after the change-over of the communication channel is completed, the mobile station measures in an idle time slot 206 a received electric field intensity, etc. on an adjacent communication channel and selects an optimum communication channel for optimum communication.

Figure 3:
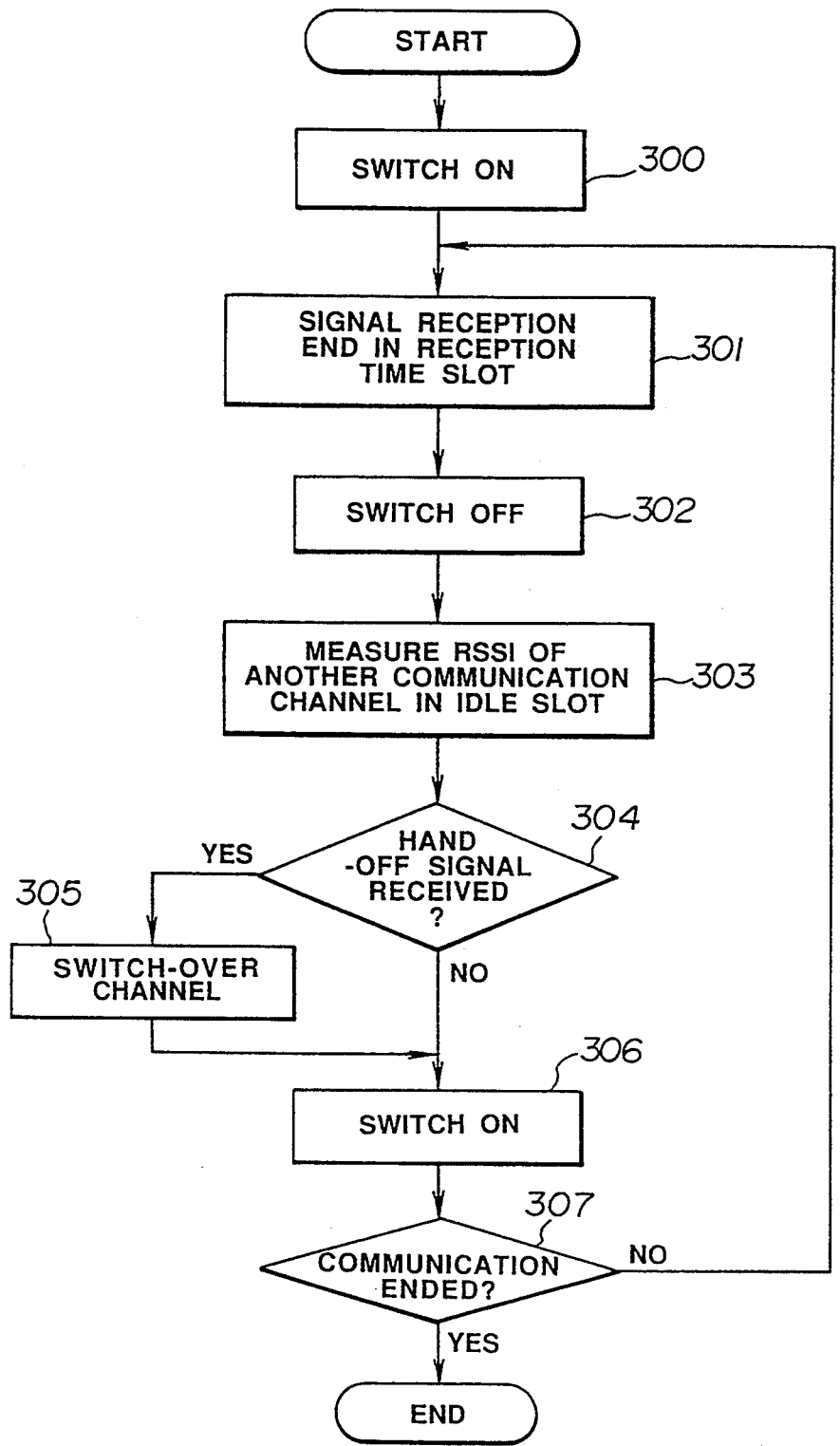
FIG. 3 is a flowchart for explaining the reception control operation of a switch 2—2 in an AGC circuit under the control of a controller (CPU) 22 of FIG. 1.

Shown in FIG. 3 is a reception flowchart far explaining the control of the switch 2-2 in the AGC circuit under control of the controller 22 in FIG. 1. In FIG. 3, the switch 2-2 is normally in its ON state and connected in series with the capacitor 2-3 (step 300). After a predetermined reception time corresponding to a reception time slot elapses, the controller 22 switches the current oscillation frequency of the reception local oscillator 21 to another local oscillation frequency for allowing reception of the frequency of an adjacent speech channel for determination of whether a hand-off should be performed (step 301). Simultaneously with the switching operation of the reception local oscillator 21, the controller 22 puts the switch 2-2 into its OFF state to cut off the capacitor 2-3 from the switch 2-2 (step 302). As a result, electric charges so far accumulated in the capacitor 2-3 at the time of receiving the signal in step 301 remain without any change, that is, this condition is kept until the switch 2-2 is turned ON. Next, in the idle time slot, the mobile station transmits to the base station the data of the received electric field intensity as the RSSI signal (step 303). Further, the mobile station (controller 22) judges whether the hand-off signal for the RSSI signal already transmitted to the base station has been received in the reception in the step 301,(step 304). If the mobile station has received the hand-off signal, then it switches the current communication channel frequency to the communication channel frequency designated by the received hand-off signal (step 305). If the mobile station has not received the hand-off signal or the communication channel has been changed over in step 305, it switches ON the switch 2-2 simultaneously with the channel change-over in the step 305 (step 306). Control then goes to step 301 to continue the communication, so long as the communication has not ended (step 307).

Figure 4:
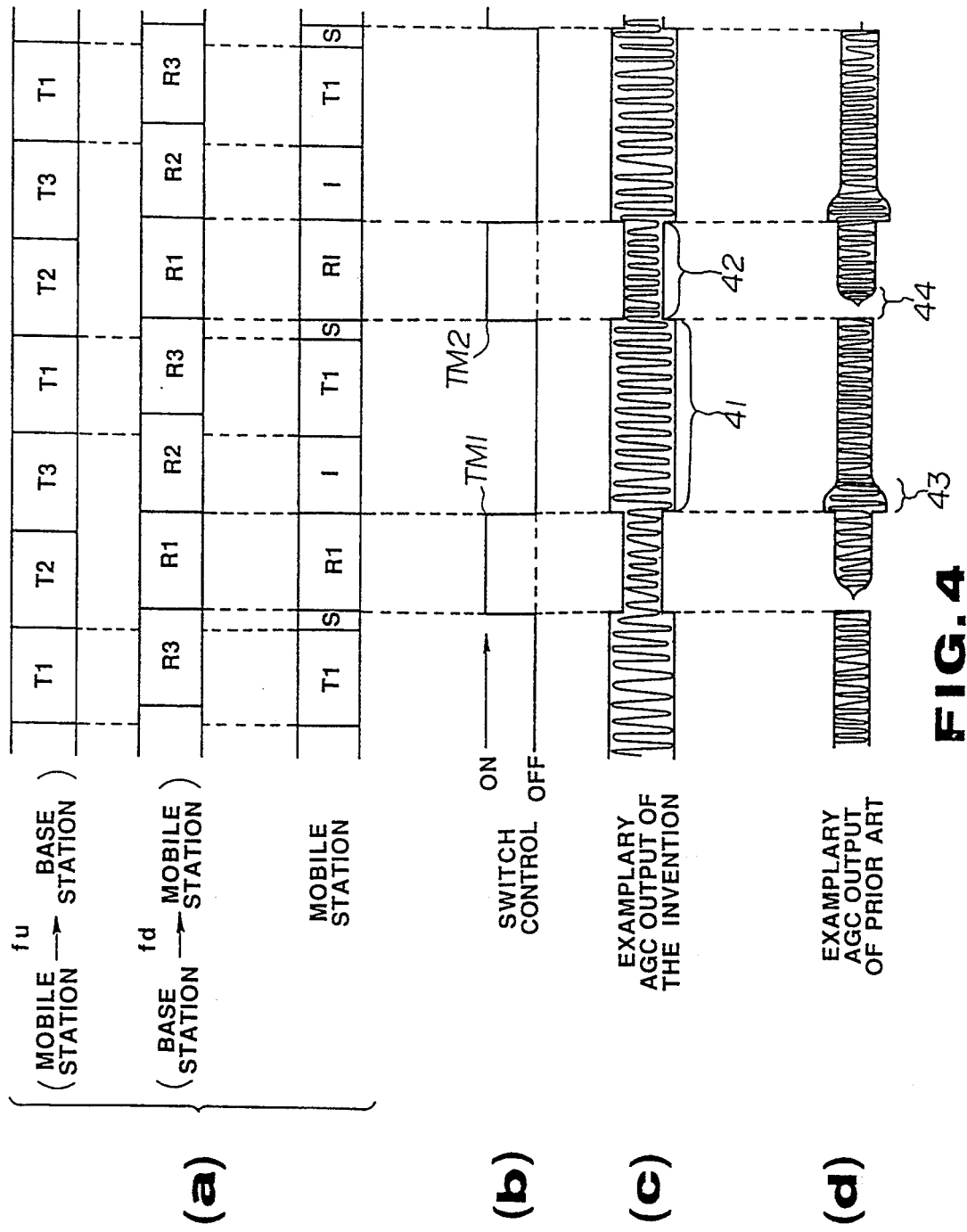
FIG. 4 is a timing chart for waveform comparison between an AGC output of the AGC circuit in the 3-channel multiplex TDMA communication system of FIG. 1 and an AGC output of a prior art AGC circuit.

FIG. 4 is the timing chart for explaining a difference in waveform between the AGC output of the AGC circuit in FIG. 1 when the 3-channel multiplex TDMA communication system is employed and the AGC output of a prior art AGC circuit. More specifically, part (a) of FIG. 4 is the diagram for explaining a relationship in the time slot between the mobile station and the base station. That is, the base station receives a signal having the frequency fu in the reception time slot or in the transmission time slots T1 to T3 as viewed from the mobile station, and the base station transmits a signal having the frequency fd in the transmission time slot or in the reception time slots R1 to R3 as viewed from the mobile station. The mobile station uses the first time slots T1 and R1 of the base station. A time slot I denotes an idle time slot and a time slot S denotes a standard offset. Part (b) of FIG. 4 is a timing chart for explaining the operation of the switch 2-2 in the AGC circuit under control of the controller 22 in FIG. whereas part (c) of FIG. 4 is a timing chart showing the waveform of the AGC output of the AGC circuit in FIG. 1. An ON period of the switch 2-2 in the Dart (b) of FIG. 4 corresponds to the signal reception period of the reception time slot R1. Simultaneously with the end of the signal reception, the switch 2-2 is turned OFF (TM1). Accordingly, a voltage at the time of the end of the signal reception is kept across the capacitor 2-3. Further, since the switch 2-2 is turned OFF to disconnect the capacitor 2-3, the AGC circuit fails to perform its normal control operation. Thus, the AGC circuit waveform becomes such a waveform as a waveform This waveform period corresponds to an idle time which is not associated with the signal reception, during which the reception local oscillation frequency of the reception oscillator is also switched to another reception local oscillation frequency simultaneously with the end of the signal reception to measure the electric field intensity of another adjacent communication channel. As a result, even when the AGC output is not normally controlled, this will not case any trouble for its own communication. Thereafter, the reception local oscillator is switched to its own reception local oscillation frequency simultaneously with the signal reception of the reception time slot R1 and at the same time, the switch 2-2 is turned ON (TM2). Since the gain control condition at the end of the signal reception of the previous reception time slot is kept in the capacitor 2-3, the AGC circuit quickly performs its normal control operation and the gain control is normally carried out from the beginning. Accordingly, the AGC output becomes such a waveform as a waveform 42.

The waveform of an AGC output of the prior art AGC circuit is as shown in part (d) of FIG. 4. More specifically, its own reception local oscillation frequency is switched to another reception local oscillation frequency simultaneously with the end of the signal reception in the reception time slot (TM1). Therefore, the normal gain control in the idle time slot cannot be initially carried out (refer to a waveform portion represented by reference numeral 43), but the AGC output becomes controlled and stationary with time to provide a constant gain. In this idle time slot, however, the AGC circuit does not perform its own communication and measures the electric field intensity of another communication channel, for which reason it is unnecessary for the AGC circuit carry out its gain control. Then, when the AGC circuit shifted to the signal reception condition in the next reception time slot (TM2), switching to its own reception local oscillation frequency is carried out simultaneously with the signal reception of the reception time slot R1 so that the gain control of the AGC circuit can be continuously carried out independently of the switching operation of the reception local oscillation frequency. For this reason, the beginning part of the signal reception of the reception time slot sometimes varies in its signal reception level and it takes time until the gain control becomes stationary, during which suitable gain control cannot be achieved (refer to reference numeral 44), which adversely affects signal reception. The switching simultaneously with the signal reception of this reception time slot is valid when the standard offset S is used for measurement of an antenna selection diversity.

Figure 5:
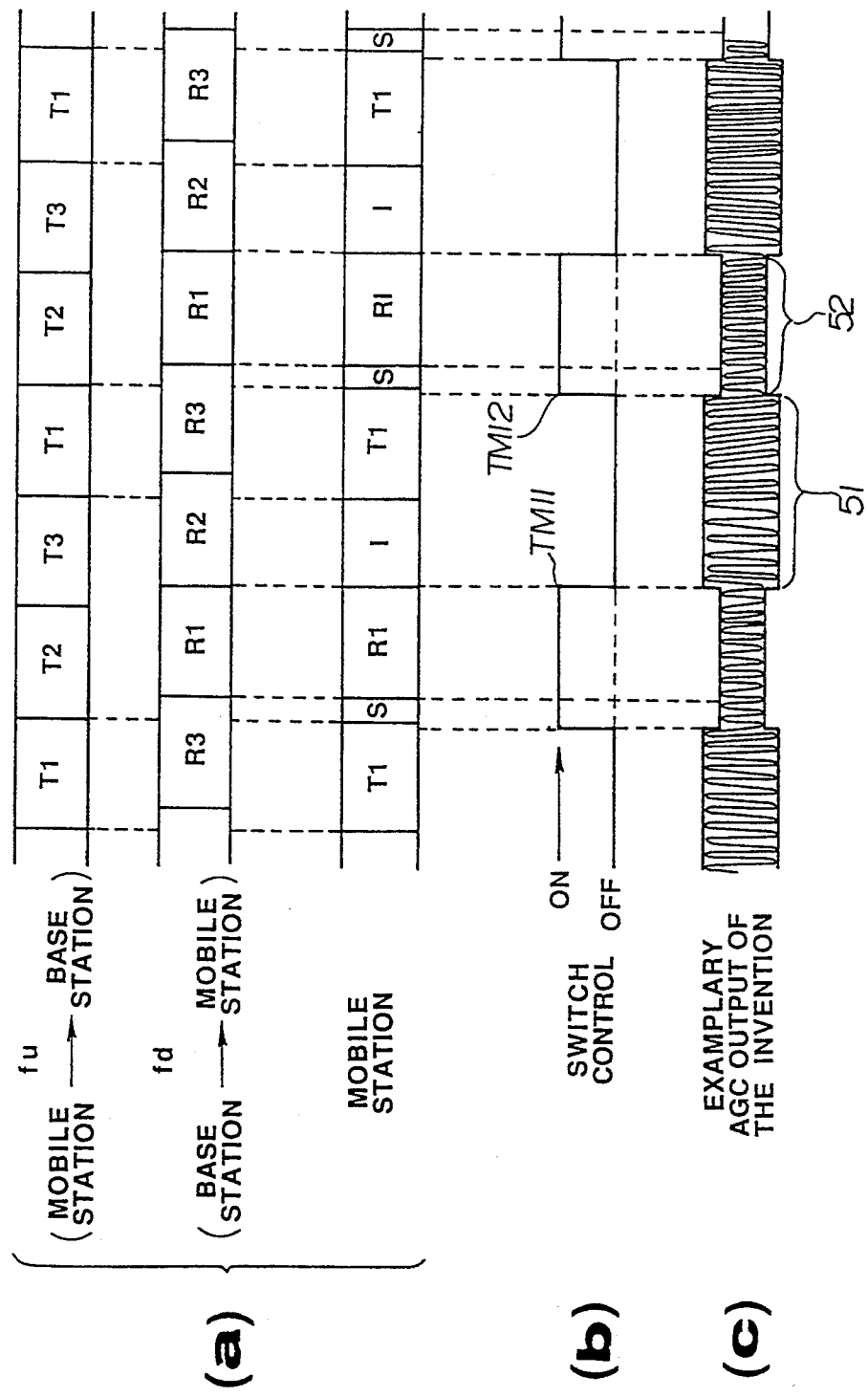
FIG. 5 is a timing chart for explaining the AGC out-out of the AGC circuit in FIG. 1 when the switching ON operation the switch 2—2 is made quickly in FIG. 4.

Referring to FIG. 5, there is shown a timing chart of the AGC output of the AGC circuit in FIG. 1 when the switching operation of the switch 2-2 is made faster. More specifically, part (a) of FIG. 5 is the same as the part (a) of FIG. 4. In part (b) of FIG. 5, as in the part (b) of FIG. 4, the reception local oscillation frequency for its own signal reception of the reception local oscillator is switched to another reception local oscillation frequency simultaneously with the end of the signal reception of the reception time slot R1 and the switch 2-2 is turned OFF (TM11). This results in that the final gain control condition of the reception time slot R1 is held in the capacitor 2-3. Thereafter, in the idle slot I, the mobile station monitors another communication channel. At this time, normal gain control cannot be realized (refer to waveform part denoted by reference numeral 51) as already explained above, but this is not associated with its own signal reception and thus does not become a problem. The switch 2-2 is turned ON immediately prior to the signal reception of the next reception time slot R1 (TM12) and the current reception local oscillation frequency is switched to the reception local oscillation frequency for its own communication. As a result, a voltage kept at the end of the signal reception of the previous reception time slot across the capacitor 2-3 can be utilized to perform a quick gain control (refer to a waveform part denoted by reference numeral 52). In addition, since the gain control having a sufficient allowance is achieved, a stable signal reception state can be maintained.

Figure 6:
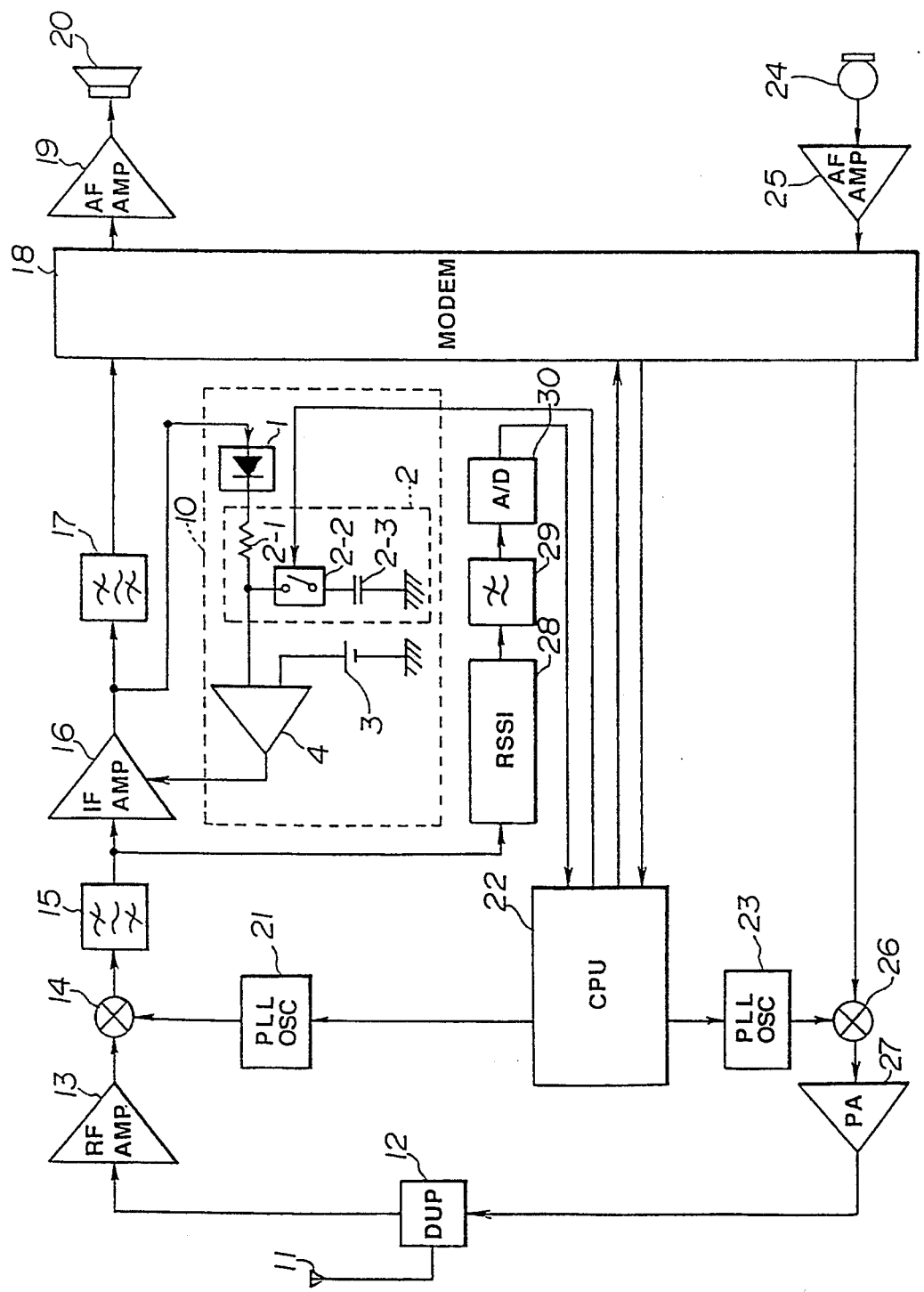
FIG. 6 is a block diagram of an arrangement of a mobile station in a mobile telephone system in accordance with another embodiment of the present invention when the AGC circuit in FIG. 1 detects an intermediate frequency signal immediately downstream of an amplifier 16 for gain control.

FIG. 6 shows a block diagram of an arrangement of a mobile station in a mobile telephone system in accordance with another embodiment of the present invention in which the AGC circuit in FIG. 1 detects the intermediate frequency signal immediately downstream of the amplifier 16 to control gain.

In FIG. 6, the same parts as those in FIG. 1 are denoted by the same reference numerals. In the present embodiment, frequency components to be removed by the band pass filter 17 other than the predetermined intermediate frequency band may be a target to be controlled by the AGC circuit. In this case, the frequency components other than the predetermined intermediate frequency band can be considered to be small in level and to have substantially the same output level variations as the predetermined intermediate frequency, whereby substantially the same effects as the gain control of the AGC circuit in FIG. 1 can be obtained.

As has been disclosed in the foregoing, the mobile telephone system in accordance with the present invention can perform gain control while avoiding the adverse effect on the signal reception of its own communication channel regardless of the presence or absence of a hand-off designation from a base station, and also can independently measure the electric field intensity or a bit error rate (BER) of a signal received on another communication channel for the hand-off during an idle time or period of its own communication.

The AGC circuit 10 in FIG. 1 may comprise a digital signal processing circuit. In this case, the AGC circuit can be high in operational stability and reliability. When a predetermined clock or a control signal from the controller 22 is applied to the AGC circuit, the amplification or gain of the intermediate frequency amplifier 16 can be controlled.

The present invention is not restricted only to such a mobile station as in a mobile telephone system but may be used also in an ordinary receiver.

Next, a description will be given for a receiver having the AGC circuit 10 of the present invention in which an extracting point of the control signal to be inputted to the AGC circuit and a target to be controlled by the AGC circuit are changed, respectively.

FIGS. 7(a) to 7(e) are block diagrams of receivers for illustrating several cases where an extracting point of the control signal to be inputted to the AGC circuit 10 is changed. In these cases, the target to be controlled by the AGC circuit 10 is an IF amplifier 70 which amplifies an intermediate frequency.

Figure 7A:
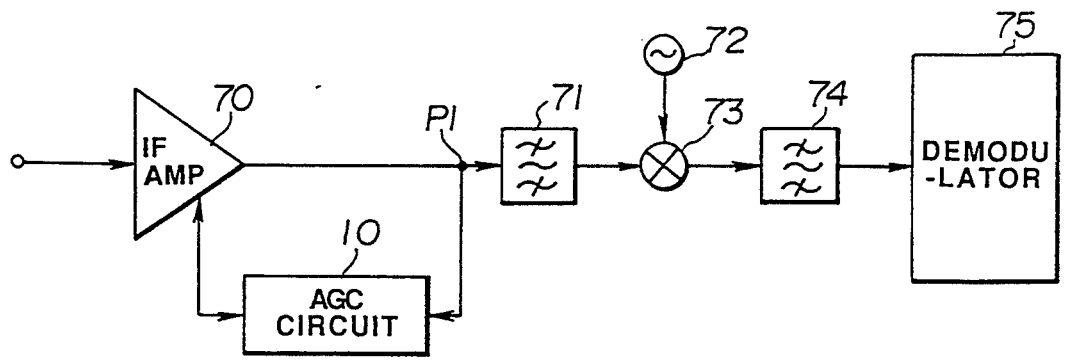
FIGS. 7(a) to 7(e) are block diagrams of receivers for illustrating examples of extracting points of a control signal to be inputted to the AGC circuit of FIG.

FIG. 7(a) shows a block diagram of a receiver in which the AGC circuit 10 is arranged in the same manner as in FIG. 6. Namely, in FIG. 7(a), a signal is extracted at an extracting point P1 between the IF amplifier 70 and a band pass filter 71 and input to the AGC circuit 10 as a control signal.

Figure 7B:
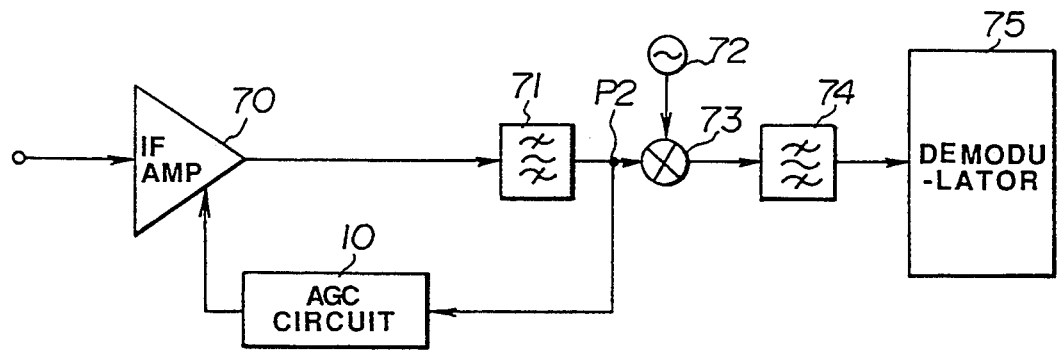

FIG. 7(b) shows a block diagram in which a signal passed through the band pass filter 71 is extracted at an extracting point P2 and input to the AGC circuit 10 as the control signal.

Figure 7C:
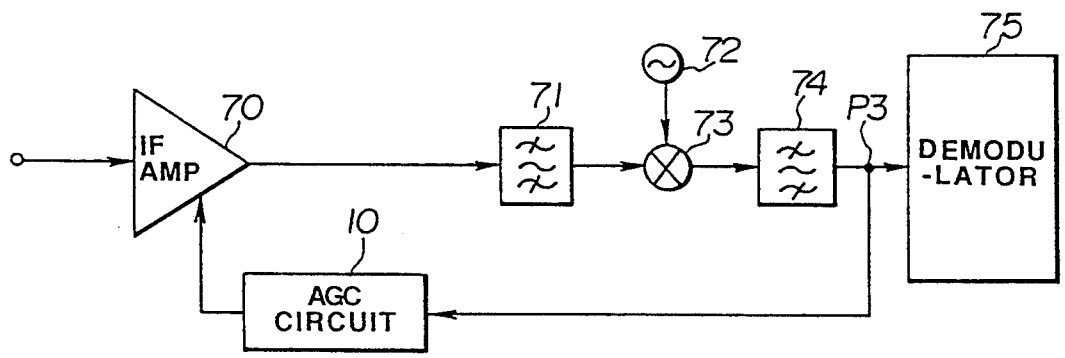

FIG. 7(c) shows a block diagram in which a signal is extracted at an extracting point P3 between a band pass filter 74 and a demodulator 75. That is, in FIG. 7(c), the intermediate frequency signal at the extracting point P3 is mixed with a local oscillation signal of a second local oscillator 72 in a mixer 73 to generate a base band signal which is subjected at the band pass filter 74 to a removal of its signal components having frequencies other than a predetermined frequency band and then finally input to the demodulator 75. The predetermined frequency band signal is extracted at the extracting point P3 and input to the AGC circuit 10.

Figure 7D:
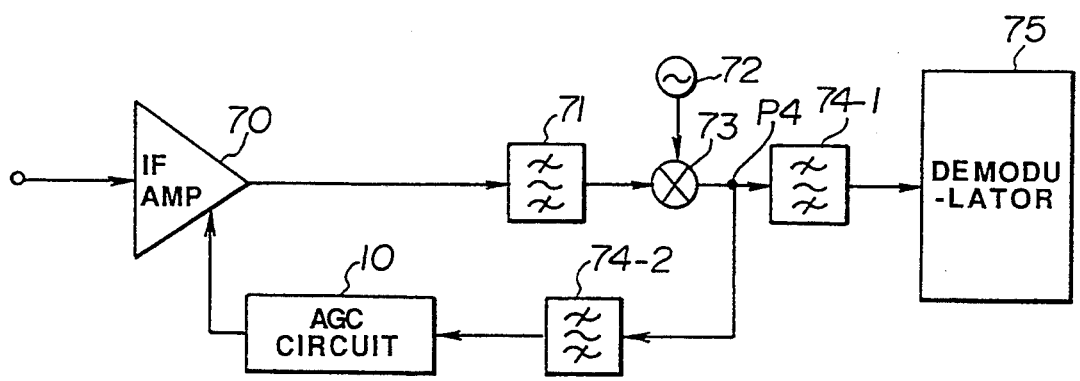

FIG. 7(d) shows a block diagram of a receiver including a band pass filter 74-2 having the same function as a band mass filter 74-1 and disposed immediately upstream of the AGC circuit 10 in which an output signal from the mixer 73 is extracted at an extracting point P4.

Figure 7E:
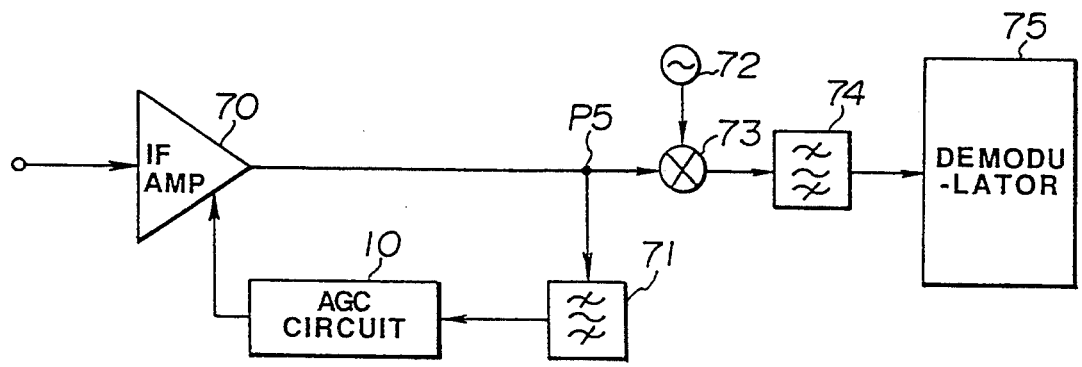

FIG. 7(e) shows a block diagram of a receiver in which the band pass filter 71 is disposed immediately upstream of the AGC circuit 10 and a signal from the IF amplifier 70 is extracted at an extracting point P5 and input to the band pass filter 71.

In FIGS. 7(a) to 7(e), each of the receivers is arranged such that the filter is disposed immediately upstream of the AGC circuit 10 and the control signal to be input to the AGC circuit 10 is extracted at the different extracting points P1 to P5. However, the gain control of the IF amplifier 70 by the AGC circuit 10 can be carried out in substantially same manner.

FIGS. 8(a) to 8(d) are block diagrams of receivers for illustrating several cases where a signal is extracted at the same extracting point but a target to be controlled by the AGC circuit 10 is different.

Figure 8A:
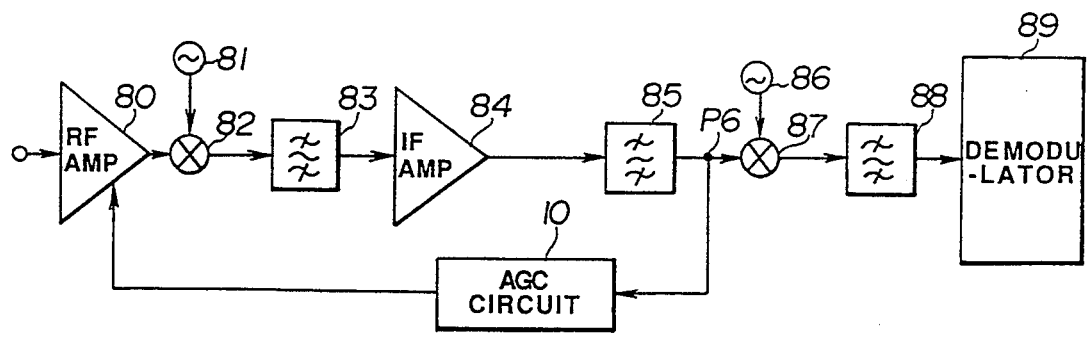
FIGS. 8(a) to 8(d) are block diagrams of receivers for illustrating examples of targets to be controlled by the AGC circuit of FIG. 1.

FIGS. 8(a) shows an arrangement in which a control signal to be input to the AGC circuit 10 is extracted at an extracting point P6, which is the same to the extracting point P2 in FIG. 7(b), for controlling the gain of an RF amplifier 80. As in this case, it may be arranged to control the RF amplifier 80 other than an IF amplifier 84.

Figure 8B:
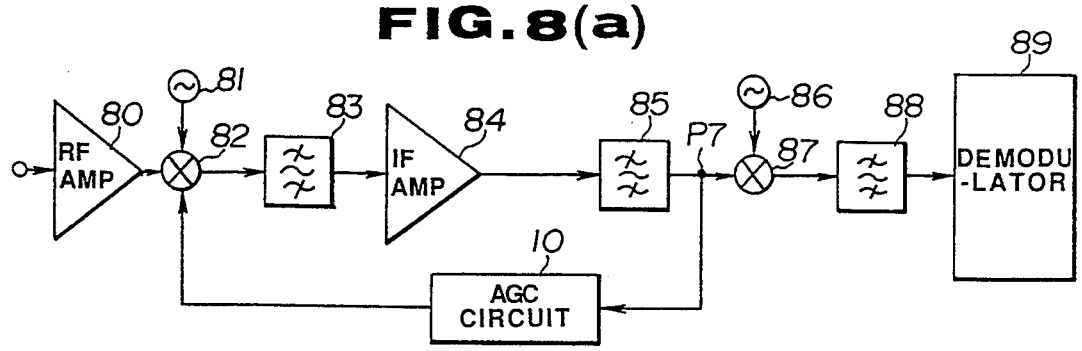

FIG. 8(b) shows an arrangement in which a mixer 82 is a target to be controlled by the AGC circuit 10, since the gain can be controlled by a mixer.

Figure 8C:
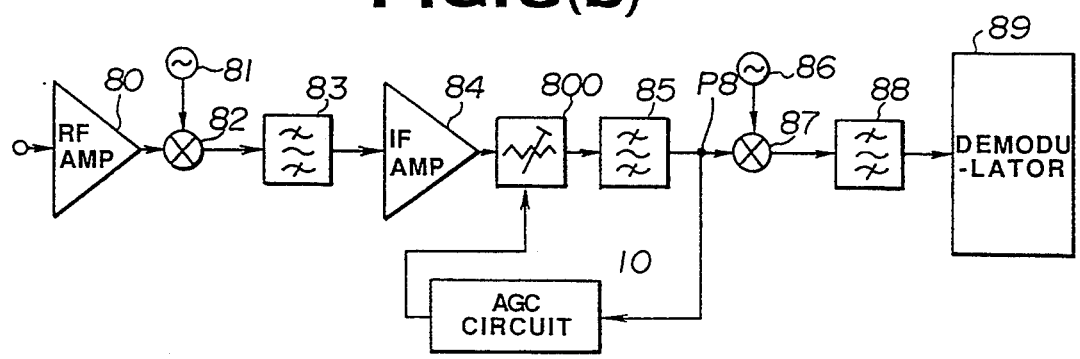

FIG. 8(c) shows an arrangement in which a variable attenuator 800 is disposed immediately downstream of the IF amplifier 84 and is a target to be controlled by the AGC circuit 10, since the gain can also be controlled by a variable attenuator.

Figure 8D:
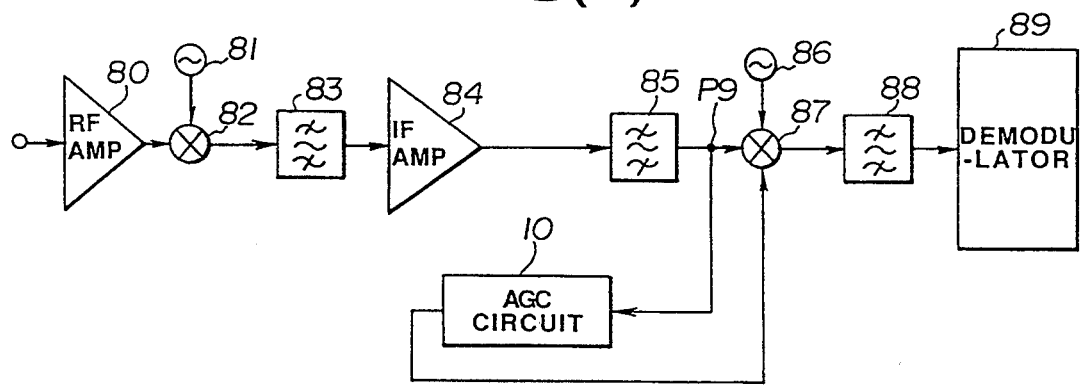
Figure 9:
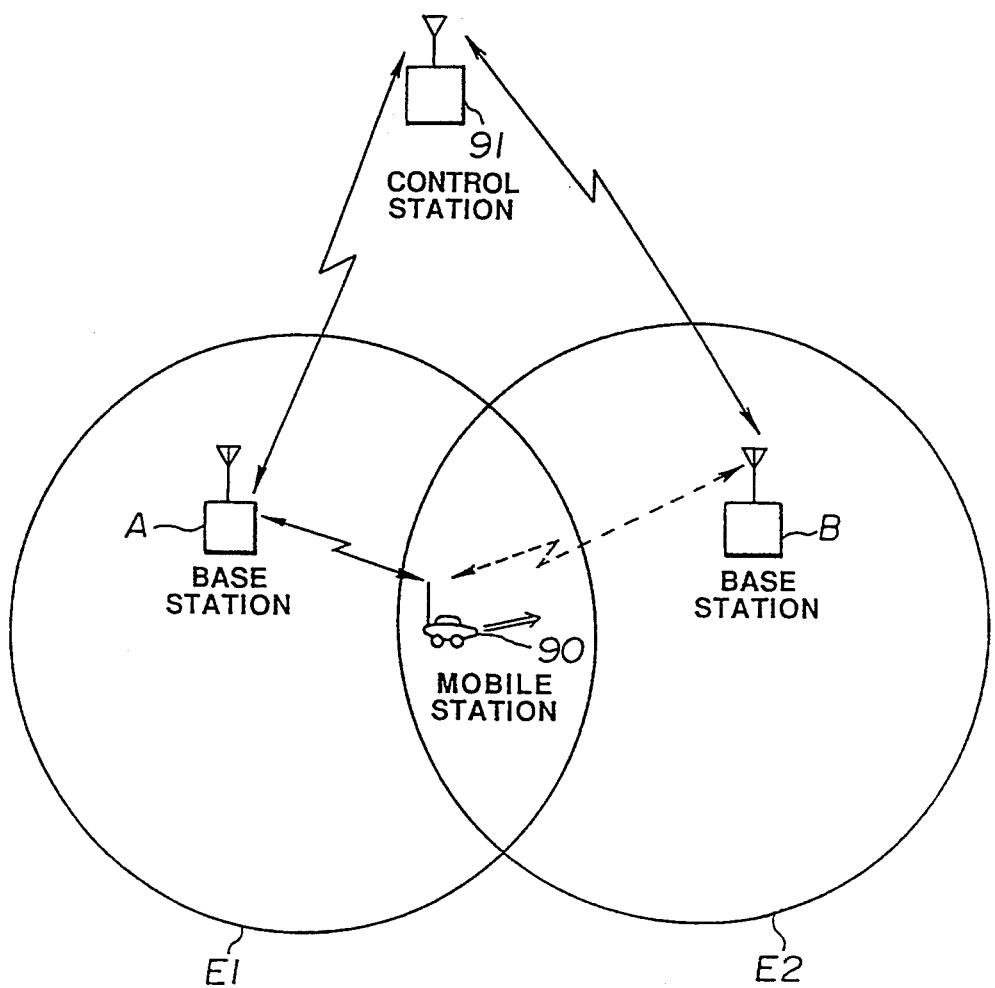
FIG. 9 is a diagram for explaining the hand-off operation of a mobile telephone system of the TDMA communication type.
Figure 10:
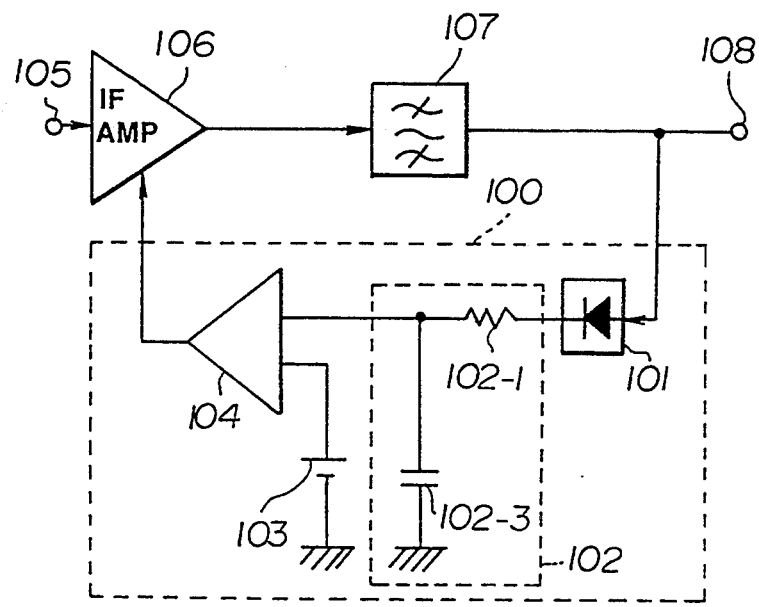
FIG. 10 is a block diagram of an arrangement of a prior art AGC circuit.

FIG. 8(d) shows an arrangement in which a target to be controlled by the AGC circuit 10 is set downstream of the signal extracting point, i.e., near to a demodulator 89. More specifically, in FIG. 8(d), a mixer 87 disposed at a point downstream of an extracting point P9 is set to be the target. As in this case, the gain of the final base band signal can be controlled.

As described above, the gain control by the AGC circuit 10 can be satisfactorily carried out by extracting a control signal to be input to the AGC circuit 10 from different extracting points, or by setting a mixer or an attenuator and the like to be the control target of the AGC circuit 10 without restricting only to an amplifier. The reference voltage source 3 in the AGC circuit 10 may differ with a control signal to be input to the AGC circuit 10 or a target to be controlled by the AGC circuit 10.

As described in the above, the present invention is not restricted only to such a mobile station in a mobile telephone system but may be used also in an ordinary receiver.

What is claimed is:

1. A gain control circuit comprising:
level adjusting means having gain, for adjusting a level of a desired input signal being inputted intermittently and for outputting a level-adjusted signal, wherein the level of the level-adjusted signal outputted from the level adjusting means is kept constant by controlling the gain of the level adjusting means;
detecting means for detecting the level of the level-adjusted signal outputted from the level adjusting means;
gain controlling means for comparing the level detected by the detecting means and a predetermined reference level and for controlling the gain of the level adjusting means based on a result of the comparison;
holding means for holding the level detected by the detecting means;
switching means for switching to connect the holding means to or to disconnect the holding means from the gain controlling means;
determining means for determining whether a signal to be inputted to the gain control circuit is the desired input signal; and
switch controlling means, responsive to the determination by the determining means, for controlling the switching means to connect the holding means to the gain controlling means at least while the desired input signal exists and to disconnect the holding means from the gain controlling means when the desired input signal does not exist, so as to hold in the holding means a level of an end portion of the level-adjusted signal corresponding to the desired input signal.

2. The gain control circuit as set forth in claim 1, wherein the level-adjusted signal outputted from the gain controlling means is an intermediate frequency signal.

3. The gain control circuit as set forth in claim 1, wherein the level adjusting means comprises a radio frequency amplifier.

4. The gain control circuit as set forth in claim 1, wherein the holding means comprises a capacitor.

5. The gain control circuit as set forth in claim 1 for use in a receiver employing a time division multiplex communication system having a plurality of channels, further comprising:
monitoring means for, during an idle time in which the desired input signal is not received, monitoring communication channels other than a channel used for communicating the desired input signal,
wherein the switch controlling means, during the monitoring performed by the monitoring means, controls the switching means to disconnect the holding means from the gain controlling means so as to hold in the holding means at least the level of the level-adjusted signal corresponding to the desired input signal received on the channel used for communicating the desired input signal.

6. The gain control circuit as set forth in claim 1 for use in a mobile station of a radio mobile communication system, wherein the switch. controlling means, when receiving a hand-off designation signal from a base station, controls the switching means to disconnect the holding means from the gain controlling means so as to hold in the holding means the level of the level-adjusted signal corresponding to a signal inputted to a reception channel previously used for communicating the desired input signal, until switching to a communication channel designated by the hand-off designation signal is completed.

7. A receiver comprising:
receiving means for receiving via an antenna a radio frequency signal transmitted in a time division multiplexing manner during a reception time slot assigned thereto, for producing a baseband signal from the radio frequency signal through a plurality of processing means including at least one level adjusting circuit having gain, and for outputting a level-adjusted baseband signal;

demodulating means for demodulating the level-adjusted baseband signal outputted from the receiving means;

detecting means for detecting a level of a signal between the antenna and the demodulating means;

gain controlling means for comparing the level detected by the detecting means and a predetermined reference level and for controlling the gain of the at least one level adjusting circuit based on a result of the comparison;

holding means for holding the level detected by the detecting means;

switching means for switching to connect the holding means to or to disconnect the holding means from the gain controlling means; and switch controlling means for controlling the switching means to connect the holding means to the gain controlling means at a time no later than a beginning of the reception time slot and to disconnect the holding means from the gain controlling means at a time no later than an end of the reception time slot, so as to hold in the holding means the level detected during the reception time slot.

8. The receiver as set forth in claim 7, wherein the switch controlling means controls the switching means to connect the holding means to the gain controlling means at the beginning of the reception time slot.

9. The receiver as set forth in claim 7, wherein the switch controlling means controls the switching means to disconnect the holding mean from the gain controlling means when the reception time slot is over.

10. The receiver as set forth in claim 7, wherein a level adjusting circuit controlled by the gain controlling means is disposed at a point nearer to the antenna than a point at which the signal is detected by the detecting means.

11. The receiver as set forth in claim 7, wherein a level adjusting circuit controlled by the gain controlling means is disposed at a point nearer to the demodulating means than a point at which the signal is detected by the detecting means.

12. The receiver as set forth in claim 7, wherein one of the plurality of processing means to be controlled by the gain controlling means is an amplifier.

13. The receiver as set forth in claim 7, wherein one of the plurality of processing means to be controlled by the gain controlling means is a mixer.

14. The receiver as set forth in claim 7, wherein one of the plurality of processing means to be controlled by the gain controlling means is an attenuator.

15. The receiver as set forth in claim 7 further including a filter disposed between the antenna and the demodulating means, wherein the detecting means detects a signal passed through the filter.

16. The receiver as set forth in claim 7 further including a filter disposed between the antenna and the demodulating means, wherein the detecting means detects a signal present immediately before the filter.

17. The receiver as set forth in claim 7 further including a filter for filtering the signal to be detected by the detecting means.

* * * * *